United States Patent [19]

Ohmi

[11] Patent Number: 5,554,938
[45] Date of Patent: Sep. 10, 1996

[54] METHOD OF EVALUATING CURRENT-DRIVEN CONDUCTIVE MATERIAL

[76] Inventor: Tadahiro Ohmi, 1-17-301, Komegabukuro 2-chome, Aoba-ku, Sendai-shi, Miyagi-ken 980, Japan

[21] Appl. No.: 387,920

[22] PCT Filed: Jun. 21, 1994

[86] PCT No.: PCT/JP94/00991

§ 371 Date: Feb. 21, 1995

§ 102(e) Date: Feb. 21, 1995

[87] PCT Pub. No.: WO95/00971

PCT Pub. Date: Jan. 5, 1995

[30] Foreign Application Priority Data

Jun. 21, 1993 [JP] Japan ..................... 5-148831

[51] Int. Cl.⁶ ..................... G01R 27/14
[52] U.S. Cl. ............. 324/693; 324/719; 165/80.2
[58] Field of Search ..................... 324/693, 719, 324/703, 713, 715, 718, 538; 361/385; 165/80.5

[56] References Cited

U.S. PATENT DOCUMENTS 5,291,142   3/1994   Ohmi ..................... 324/719

FOREIGN PATENT DOCUMENTS 1-500784   3/1989   Japan.
3-77080    4/1991   Japan.
4-186745   7/1992   Japan.
4-329654   11/1992  Japan.

*Primary Examiner*—Kenneth A. Wieder
*Assistant Examiner*—Barry C. Bowsel
*Attorney, Agent, or Firm*—Baker & Daniels

[57] ABSTRACT

An object of the present invention is to provide a method of evaluating current-driven conductive material in which a capability of wiring material to withstand electro-migration and that to withstand stress migration can be evaluated independently.

In the method according to the present invention wherein reliability of wiring is evaluated with a shorter period of time by repeating an operating cycle comprising the steps of flowing a first current to measure a resistance value, flowing a second current having a larger current value than the first current for a specified period of time to generate changes in the physical properties, and then flowing the first current to measure a resistance value of the wiring, the wiring's capability to withstand electro-migration is measured by making a time for flowing the second current fully smaller than a time for flowing the first current to control temperature rise when the second current is flown to 50° C. or below. Also stress migration of wiring is measured by adjusting the second current to a current value at which electro-migration does not occur, setting the operating cycle to less than 10 msec, and also setting a time for flowing the second current so that temperature rise when the second current is flown is 100° C. or more.

6 Claims, 4 Drawing Sheets

METHOD OF EVALUATING CURRENT-DRIVEN CONDUCTIVE MATERIAL

TECHNICAL FIELD

The present invention relates to a method of evaluating current-driven conductive material, and more particularly to a method of evaluating electro-migration resistance and stress migration resistance of various types of current-driven conductive material independently and efficiently.

TECHNOLOGICAL BACKGROUND

The conventional technology is described below for a wiring material for LSI as an example of current-driven conductive material. As wiring material for LSI, at present, such materials as Al, Al—Si alloy prepared by mixing several percents of Si in Al or Al—Si—Cu alloy in which a small quantity of Cu is mixed have been used.

As a degree of integration in LSI becomes higher and higher, a width of wiring therein becomes thinner and thinner with the length becoming increasingly longer, and also a number of wires used therein is becoming larger. On the other hand, in LSI, a higher operating speed is required together with a higher degree of integration, and as a result, a current flowing in a wire has been becoming increasingly larger. Namely density of a current flowing per unit cross section has been becoming higher and higher as a degree of integration becomes increasingly higher. However, when a large current flows in a metallic wire, metal atoms moves in a direction reverse to that in which the current flows, and as a result a portion of the wire may become thinner and thinner and sometimes result in breaking of wire. This phenomenon is called electro-migration. Furthermore when density of a current flowing through wiring increases, heat stress due to Joule heat generation in the wiring and the wiring is deteriorated. This phenomenon is called stress migration. It is not too much saying that reliability of metal wiring is decided by the two phenomena described above. For this reason, in order to develop a high performance LSI, a material having a high capability to withstand the electro-migration and stress migration is required, and in development of the material, it is important to strictly evaluate the material's capability to withstand the phenomena. The conventional method of evaluating reliability of wiring is as described below.

In the conventional type of LSI wiring, only a current having a density of around 105 A/cm² is flown, but in the reliability test, a current with a current density of $10^6$ A/cm², 10 times or more larger than the usual one, is flown to shorten the time required for a wiring reliability test. In addition, to furthermore promote deterioration, a method is employed in which a temperature of atmosphere is raised to around 250° C. However, also in the deterioration promoting test as described above, breaking of wiring does not occur within a month in case of ordinary Al—Si alloy wiring having a short life, and actually, for instance, resistance of wiring is monitorred, and a time required until the resistance increases by 5% or by 10% is used as a life of the wiring. In spite of that, in many cases, a period of time ranging from several weeks up to around one month is required until a resistance value of wiring shows the change as described above, and in case of material for wiring having a higher reliability, which is a target for material development, a further longer time is required, and for the reasons as described above, practically the method is not effective as a method of evaluating material for wiring.

So, in order to furthermore shorten a time required for a deteriorating test, it is desired to flow a current having a higher density. However, if it is tried to flow a current with a high density, the wiring is heated because of Joule's heat, and consequently the resistance becomes higher, which furthermore promote heating of the wiring, and as a result the wiring temperature becomes uncontrollable, which results in melting of the wiring.

To solve this problem, the present inventor succeeded in shortening a time required for a reliability test for wiring, without causing melting of wiring, by repeating the operational sequence comprising the steps of flowing a first current in a wiring pattern, then measuring a resistance value of the wiring, then flowing a second current having a larger current value than the first current to heat this wiring, simultaneously controlling temperature of the wiring pattern by means of cooling it from the outside to prevent the wiring temperature from becoming uncontrollable, turning off the second current, and then again flowing the first current (Japanese Patent Application No.126732/1991). However, although it is possible to shorten a time required for a reliability test of wiring, a problem was found that whether the wiring is deteriorated due to electro-migration or due to stress migration can not be discriminated. To furthermore minutely investigate a reliability of wiring, it is required to discriminate which of these phenomena is the case for deterioration o wiring.

The present invention was made in the light of the circumstances as described above, and it is an object of the present invention to provide a method of evaluating current-driven conductive material which enables independent evaluation of a capability of wiring material to withstand electro-migration and stress migration within a short period of time and also enables feedback of test data effective for development of wiring material.

DISCLOSURE OF THE INVENTION

A first gist of the present invention consists in a method of evaluating current-driven conductive material characterized in that, in a method of evaluating within a shorter period of time a capability of the wiring pattern to withstand electro-migration by repeating several times an operating sequence comprising the steps of flowing a first current in a wiring pattern made of conductive material, then measuring a resistance value of the wiring, then flowing a second current having a larger current value than the first current to generate electro-migration in the wiring pattern, turning off the second current, and then again flowing the first current, a capability of the wiring pattern to withstand electro-migration is measured by controlling temperature rise while the second current is flowing at a level by 50° C. lower or more than the temperature while the first current is flowing by means of setting a time for flowing the second current fully shorter than the time for flowing the first current.

A second gist of the present invention consists in a method of evaluating current-driven conductive material characterized in that, in a method of evaluating within a shorter period of time a capability of the wiring pattern to withstand stress migration by repeating several times an operating sequence comprising the steps of flowing a first current in a wiring pattern made of conductive material, then measuring a resistance value of the wiring, then flowing a second current having a larger current value than the first current to generate stress migration in the wiring pattern, turning off the second current, and then again flowing the first current, stress migration generated in the wiring pattern is measured by setting the second current to a current value at which practically electro-migration does not occur, setting a repeat cycle of flowing the second current to 10 msec or less, and also setting a time for flowing the second current so that temperature of the wiring pattern while the second current is flowing will be 100° C. or more higher than temperature whole the first current is flowing.

FUNCTION

A resistance value is monitorred by flowing a first current having a current density not generating electro-migration, electro-migration is generated by flowing a second current having a high current density, and a capability of wiring to withstand electro-migration is measured regarding the time required until the resistance value drops to a specified value as a life of the wiring. In this step, by setting a time and a cycle for flowing the second current so that temperature due to Joule's heat generated when the second current is loaded to wiring will not rise to 50° C. or more higher than temperature of the wiring generated when the first current is flow, it is possible to prevent acceleration of electro-migration caused by temperature rise due to uncontrolable heat dissipation which can hardly be controlled and also to measure electro-migration at a specified temperature. Also as temperature rise in the wiring is held under 50° C., practically stress migration does not occur, and as a result it is possible to accurately estimate only the wiring's capability to withstand electro-migration under any conditions using the Black's empirical expression (Expression (1)).

On the other hand, in measurement of stress migration, by setting a loading time and a current density of a second current are set to values at which electro migration does not occur but temperature rise due to Joule's heat can be observed, loading this second current repeatedly to cause stress migration, and monitorring a resistance value of wiring while a first current having a current density not causing temperature change in the wiring is flown, it is possible to evaluate the capability to withstand stress migration.

EMBODIMENT EXAMPLES

Hereinbelow, embodiment examples of the present invention are explained.

FIG. 1 shows a device used for evaluation of a capability of wiring to withstand electro-migration as well as a capability thereof to withstand stress migration. In this figure, designated at the reference numeral 1 is a substrate on which wiring made of conductive material is formed, at 2 a printed board having a pin for connection with outside, at 3 a substrate holding means, at 4 a vessel for heated fluid, at 5 a heated fluid inlet port, at 6 a heated fluid discharge port, at 7 a heated fluid inlet pipe, at 8 a partition, at 9 a flow rate control means, at 10 a flow meter, at 11 a heated fluid temperature control means, and at 12 piping.

A typical example of conductive material is, for instance, material for LSI. Material for LSI includes, for instance, Al, Al—Si (2 to 5%) alloy, Al—Si (1 to 5% (—Cu (1 to 5%) alloy, Cu, W,Mo, Ti, $WSi_2$, $MoSi_2$, $TiSi_2$, or polysilicon, and wiring in which these materials are deposited in a layered form, such as wiring in which, for instance, high melting point materials are overlaid alternatively. In addition, also superconductive material is one of the conductive materials.

As a substrate, for instance, Si wafer, a substrate with a 0.01 to 1 μm silicon oxide film or a silicon nitride film formed thereon, a glass substrate, a ceramic substrate made of such a material as alumina, a copper substrate with an insulating film made of such as material as $SiO_2$ formed thereon are available. In case of a copper substrate, the thermal conductivity is high and accordingly the cooling efficiency becomes higher, and for this reason it is possible to carry out an experiment at a higher current density. On the substrate as described above, a thin film made of wiring material is formed by means of, for instance, deposition, sputtering, CVD, or MOCVD method with a thickness from 0.7 to 1 μm, and a wiring pattern for measuring a capability of the wiring to withstand electro-migration or stress migration with a length in a range from 0.1 to 1 mm and a width in a range from 0.3 to 5 μm is formed.

As a means for holding a substrate (substrate holding means), anything is allowable on the condition that it can hold a substrate with a wiring pattern formed thereon and can be fitted to a temperature control means, but a copper plate, an aluminium plate or a ceramic plate having a diameter larger than that of a substrate and a thickness from 2 to 5 mm is preferable. Of these, a copper plate having a high thermal conductivity is especially preferable. A substrate may be adhered to the substrate holding means using, for instance, low melting point metal such as indium. Furthermore a plurality of substrates may be held by a substrate holding means. In addition to a substrate, a printed board for drawing for connecting a wiring pattern to a power supply unit or a measurement instrument may be held by the substrate holding means.

In the present invention, a means for flowing a first current in wiring comprises a connecting means, such as, for instance, wire bonding, for connecting a pad section of a wiring pattern to a corresponding pad of a printed board, a connecting means, such as, for instance, a connector, for connecting a drawing pin of the printed board to a power supply unit, and a power supply unit.

A means for measuring a resistance value of wiring comprises a connecting means such as, for instance, wire bonding for connecting a pad section of a wiring pattern to a corresponding pad of a printed board, a connecting means such as, for instance, a connector for connecting a pin of the printed board to a voltmeter, and a voltmeter.

As a means for flowing a second current having a larger current value than a first current, a means for flowing a first current may be shared, or it may be provided separately. In this case, power supply is not limited to DC power supply, and AD power supply may be used. Also the AD power supply may be either one having a sinosoidal wave output or one having a pulse output. It is needless to say that DC current with AD current superimposed thereon may be used. For measuring stress migration, it is preferable to use AD power supply, and it is especially preferable to use AD power supply having the same absolute value. With this means, electro-migration can be suppressed furthermore, and it is possible to measure stress migration under a high current density and high temperature.

As a means for controlling temperature of a substrate (wiring), for instance, what is shown in FIG. 1 is used. The heated fluid inlet port 5 is connected to the heated fluid inlet pipe 7 inside the vessel 1, and heat generated in the wiring is efficiently removed or heat is supplied to the wiring, so that a tip of the inlet pipe is located just under the substrate 1. Inside the vessel, the partition 8 surrounding the inlet pipe 7 is provided to prevent air from residing therein. The discharge port 6 is fitted to a position lower than an upper edge of the partition and is communicated to an inlet port of the heated fluid temperature control means through a heat-insulating pipe 12. On the other hand, the heated fluid inlet port 5 is connected via the flow meter 10, flow rate control means 9, and heat-insulating pipe 12 to the heated fluid temperature control means 11.

The heated fluid flow rate control means 9 and the heated fluid temperature control 11 are provided to control a flow rate and a temperature of heated fluid according to an input signal provided from the wiring temperature detecting means and to maintain temperature of the wiring at a specified value.

Anything is available as a temperature detecting means on the condition to it can measure temperature of wiring. For instance, the means for flowing the second current and the means for measuring a resistance value can be used as they are. Namely it is possible to obtain temperature of wiring by previously measuring temperature characteristics of specific resistance in wiring, obtaining a wiring resistance value from a voltage difference between both edges of the wiring when the second current is flown, and them referring to the specific resistance temperature characteristics. In addition, a contact type of thermometer such as a thermocouple or a non-contact type of thermometer such as a collector element or a thermopile may be used.

Wiring temperature is maintained at a specified value by controlling a flow rate and a temperature of a heated fluid. As a means for controlling a flow rate of a heated fluid, a general valve may be used, but an electro-magnetic valve, which can control a flow rate of a heated fluid according to an output signal from the temperature detecting means described above, is preferable. As a means for controlling temperature of a heated fluid, for instance, a thermostatic bath is used, but a thermostatic bath having a heater and a cooler for controlling a temperature of a heated fluid according to an output signal from the temperature detecting means like in case of the flow rate control means is preferable. Next description is made for a method of evaluating a life of a conductive body against only electro-migration with reference to FIG. 2(a). FIG. 2(a) shows change in a resistance value of a wiring pattern when a first current and a second current are flown repeatedly.

A current not causing electro-migration, for instance, a current with a current density in a range from 102 to 106 A/cm$^2$ is flowing in a conductive wiring pattern and an initial resistance value of the wiring is obtained from a voltage difference between two edges of the wiring. Then a second current having a pulse width so small that temperature rise due to Joule's heat dissipation can not follow is loaded. This pulse width is decided from a relation between this pulse width and a current density to be used, and in case of a current density in range from 106 to 109 A/cm$^2$, a pulse width in a range from 10 psec to around 50 nsec is used. Also a duty ratio of less than 50% is usually used. For this reason, the wiring temperature then is set by only a substrate temperature control means. Intensity of a second current then is defined with an output current value of a pulse. For this reason intensity and a testing temperature of a current causing electro-migration can be controlled separately. For measuring different temperatures, a temperature of a heated fluid may be changed. On the other hand, temperature rise due to a second current can be suppressed to below 50° C., so that stress migration can practically be ignored.

After a pulse is loaded, a resistance value is again measured. The resistance value then becomes larger than the initial value because of the electro-migration effect caused by a second current loaded thereto. When the cycle above is repeated, the resistance value becomes gradually larger, the time required until the resistance value becomes by 5% or 10% larger than the initial value is regarded as a life of the wiring. This life may be defined depending on any period of time required for any degree of change in a resistance value on the wiring. Measurement of the resistance value when a first current is flown may be carried out after a second current pulse is loaded several times repeatedly.

In the present invention, the first current may be either DC current or AD current. In case of AD current, electro-migration effect generated when the resistance value is measured is suppressed. Deterioration of wiring due to electro-migration is generally as indicated by the empirical expression (1) below.

$$\tau = (A/J^n) \cdot \exp(E/kT) \qquad (1)$$

(Normally n=2)

τ: Life
k: Boltzmann' constant
T: temperature (K)
J: Current density
E: Activated energy
A: Constant As clearly indicated by the expression (1), unknown constants A and E are decided by carrying out the above testing under two or more different temperatures. As a result, a product of a life by a current density can be obtained for electro-migration under any temperature, and for instance, it is possible to estimates a life under a certain current density or a maximum allowable current density to a required life.

As described above, with the present invention, as heat dissipation from wiring little contributes to temperature rise thereof, uncontrollable temperature rise can be suppressed, and resultantly a current having a higher current density can be flown, and also it is possible to carry out a withstand electro-migration evaluation test under a higher temperature. Namely, it becomes possible to carry out the withstand electro-migration test within a shorter period of time.

Next description is made for a method of determining a life of a conductive body only against stress migration. FIG. 2B shows change in a resistance value of a wiring pattern when a first current and a second current are flown repeatedly. A first current with a current density in a range from 102 to 104 A/cm$^2$ is flown in a conductive wiring pattern, and an initial resistance value of wiring is obtained from a voltage difference between both edges of the pattern. Then a second current is loaded using a pulse current with a current density, at which the electro-migration effect is small, for instance in a range from 104 to 106 A/cm$^2$ and yet at which dissipation of Joule's heat occurs adequately. The wiring temperature then is decided not only by the substrate temperature control means, but also by Joule's heat generated in the wiring. Intensity of the second current is defined with an output current value of the pulse.

After a pulse is loaded, a resistance value is again measured. The resistance value then becomes larger than the initial value because of the stress migration effect caused by a second current loaded thereto. When the cycle above is repeated, the resistance value becomes gradually larger, the time required until the resistance value becomes by 5% or 10% larger than the initial value is regarded as a life of the wiring. This life may be defined depending on any period of time required for any degree of change in a resistance value on the wiring. Measurement of the resistance value when a first current is flown may be carried out after a second current is loaded several times repeatedly.

In the present invention, the first and second currents may be either DC current or AD current.

As described above, in the present invention, heat is generated when a second current is flown, but as a current is loaded in a form of pulses, the effect by stress generated by dissipation of Joule's heat becomes larger, and it becomes possible to obtain change of a resistance value due to only stress migration within a shorter period of time. Also as unnecessary heat generated when a second current is flown to heat wiring can effectively be removed by the substrate temperature control means, and as a result uncontrollable temperature rise can be suppressed. Namely by flowing a current having a longer pulse width, it becomes possible to carry out the withstand stress migration evaluation test under a higher temperature.

DESCRIPTION OF REFERENCE NUMERALS

Figure 1:
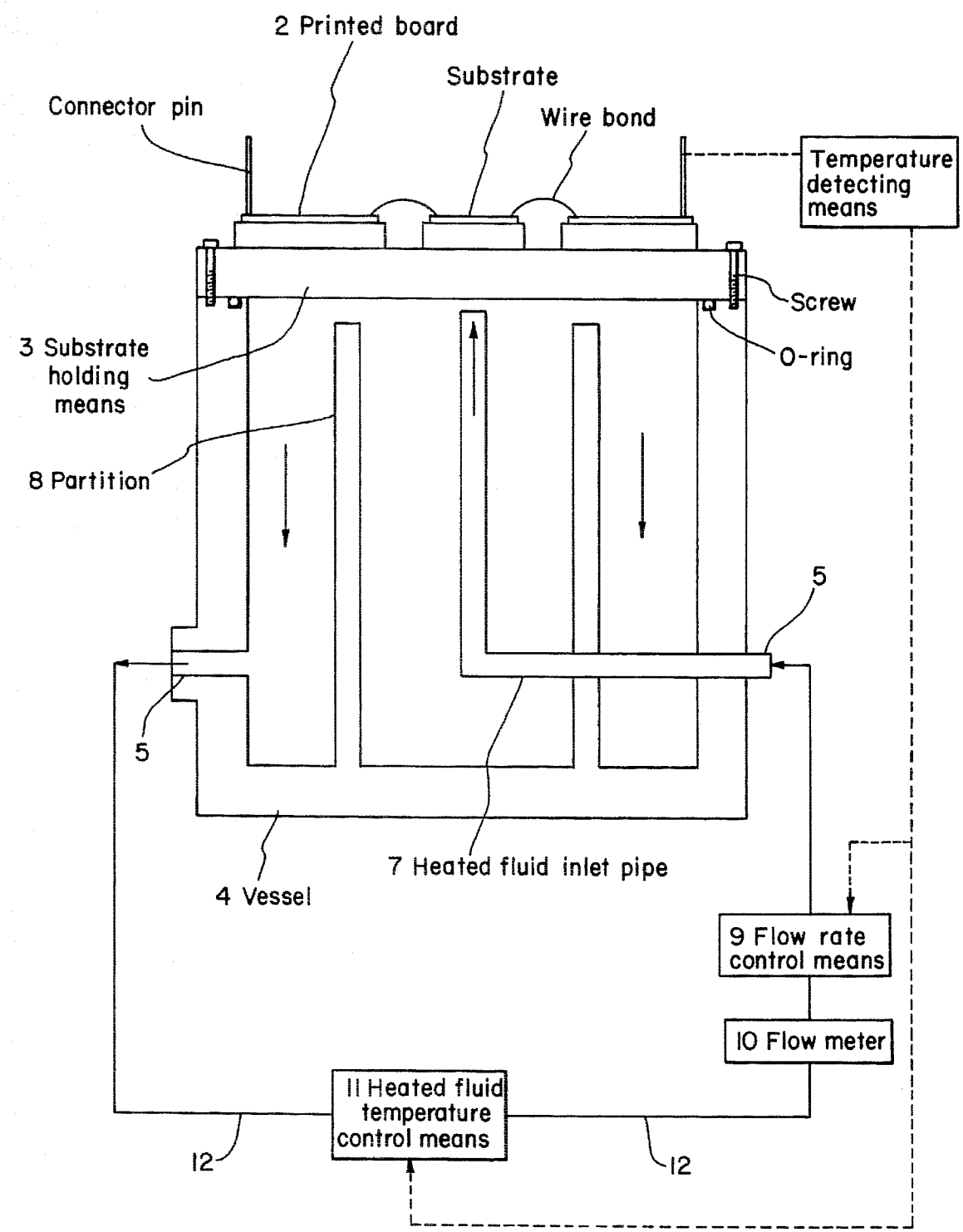
FIG. 1 is a concept diagram illustrating configuration of a current-driven conductive material evaluating apparatus.
Figure 2A:
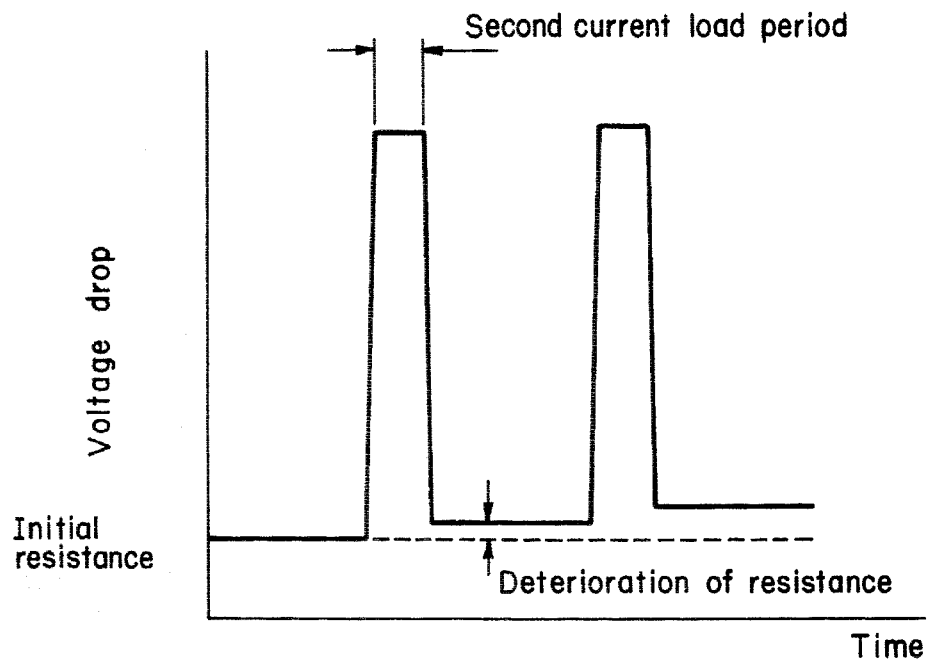
FIG. 2 is a graph showing change in a resistance value of a wiring pattern when a first current and a second current are flown repeatedly.
Figure 2B:
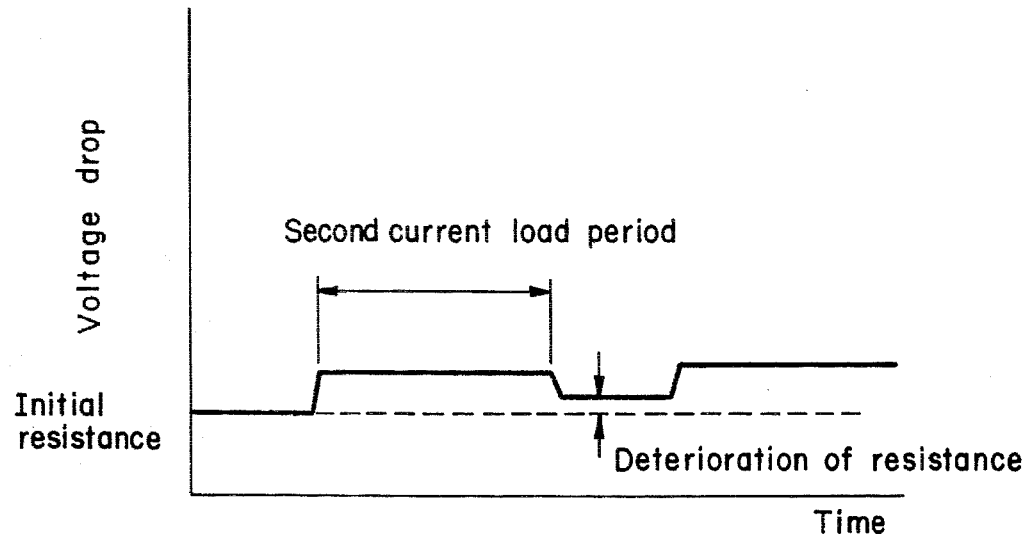

1: Substrate
2: Printed board
3: Substrate holding means
4: Vessel
5: Heated fluid inlet port
6: Heated fluid discharge port
7: Heated fluid inlet pipe
8: Partition
9: Flow rate control means
10: Flow meter
11: Heated fluid temperature control means
12: Piping

BEST MODE FOR CARRYING OUT THE PRESENT INVENTION

Next description is made for embodiments of the present, and it should be noted that the present invention is not limited to these embodiments.

A cu film having a thickness of 1 μm was formed by means of deposition or sputtering on an Si wafer with a 5 μm thermally oxidized film on a surface thereof. Then by etching, 100 pieces of 1 mm×1 mm VANDER PAUW pattern were formed on a substrate. A silicon oxide film having a thickness of 1 μm was formed on a surface of the wafer by means of CVD method, and the pad section was removed by etching, and then a substrate was formed by dicing.

This substrate and a ceramic printed board having a pad for wire bonding as well as a pin for drawing to outside were adhered to a 50 mmφ and 2 mmt copper plate using indium, and then wiring on the substrate and the corresponding pad on the printed board were connected to each other by means of wire bonding. This copper plate was fixed through an O ring to the vessel shown in FIG. 1 with screws. The heated fluid inlet port and a discharge port of the vessel were connected to a thermostatic bath, and the heated fluid was always maintained at a specified temperature.

Figure 3:
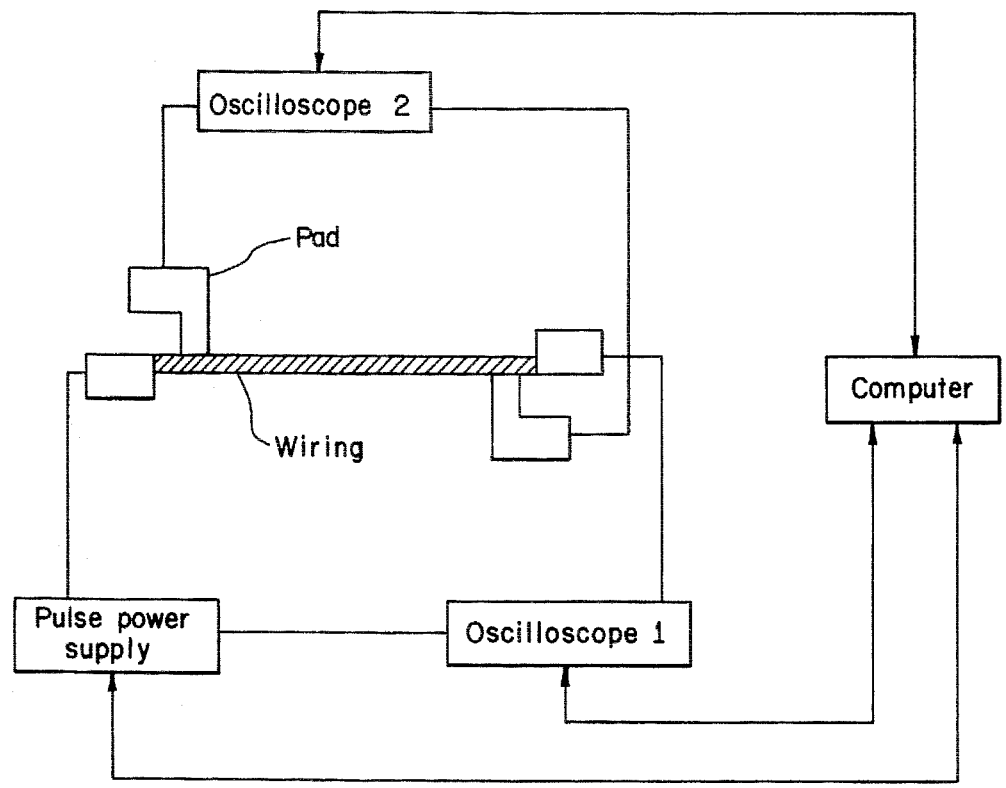
FIG. 3 is a concept diagram illustrating configuration of an evaluation/measurement system.

As shown in the concept diagram in FIG. 3, a pulse power supply source and an oscilloscope 1 are connected in series to one of the two sets of pad, and an oscilloscope 2 was connected to a pad 2 in the other set. In this embodiment, signal inlet/outlet ports of the pulse power source and oscilloscopes 1,2 are connected to a computer, and a value of a first current, a value of a second current, on/off timing, a resistance value of wiring, temperature of the wiring, and temperature of heated fluid were computed and controlled by the computer. Then a life of the wiring against electro-migration was obtained in the following way.

At first, a first current was flown in each wiring, and a resistance value of each wiring was measured. Then, the current value was transitionally risen to a second current value corresponding to a specified current density, the second current was maintained for a short period of time so that the temperature would not rise, and then the current value was transitionally dropped to the first current value, thus a resistance value being measured. The above operating sequence was repeated until the resistance value rose by 5% from the initial value.

The first current and the second current had a current density of $1\times10^4$ A/cm$^2$ and 0.5 to $1.5\times10^7$ A/cm$^2$, a pulse width of 10 nsec, and a duty ratio of 0.5 respectively. The temperature of the heated fluid was set to 77° C. and 127° C. respectively. The wiring temperature when the current temperature was flown was obtained from a resistance value when the second current was flown, but temperature rise was not observed in any case of current density in a range from 0.5 to $5\times10^7$ A/cm$^2$.

Figure 4A:
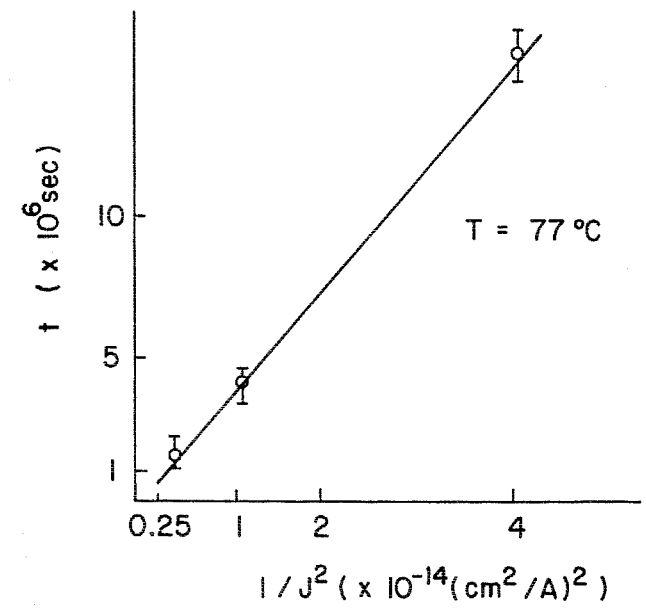
FIG. 4 is a graph showing a relation between a life ($\tau$) of a Cu sputter film against electro-migration at a given current density and a current density $1/J^2$.
Figure 4B:
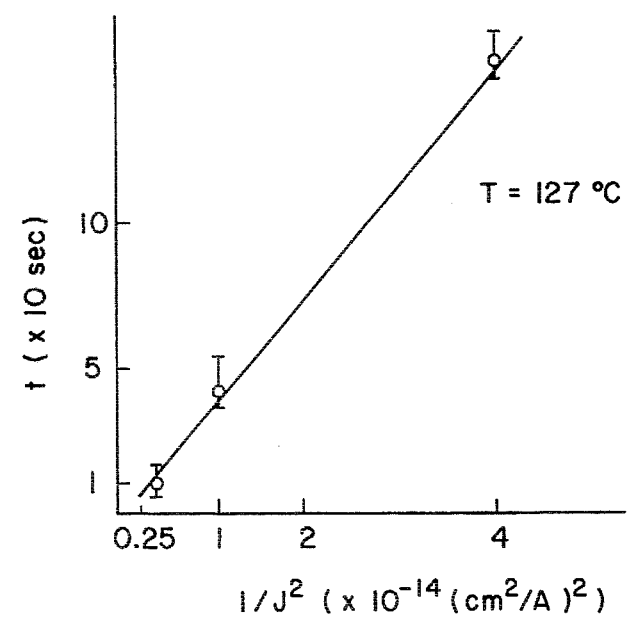

The life time until a resistance value of the wiring rose by 5% is shown in FIGS. 4 (a), (b). The straight lines in the figures were obtained by subjecting average values of data at each temperature to linear approximation by means of method of least square. Slopes of straight lines in FIGS. 4 (a), (b) coincided with each other. Namely, the expression (1) was satisfied, indicating that E and A can accurately be measured by carrying out measurement changing a temperature. In this embodiment, E was 1.2, while A was 3. In the conventional type of measurement, E is 0.8 and A is 2.65, indicating that, according to this embodiment, effect by stress migration can be eliminated and deterioration of wiring due to only electro-migration can be achieved.

As described above, with the present invention, it is possible to evaluate a capability of wiring material to withstand electro-migration.

Then, a life of wiring against stress migration was measured in the following way.

At first a first current was flown in each wiring, and each resistance value was measured. Then the current value was transitionally raised to a second current value corresponding to a specified current density to raise the temperature, and then the current value was transitionally dropped to the first current value, and the resistance value was measured.

The first and second currents had a current density of $1\times10^2$ A/cm$^2$ and $4\times10^4$ A/cm$^2$, the second current had a pulse width of 100 nsec and 10 μsec, and a duty ratio of 0.5, and a temperature of the heated fluid was set to 127° C. Temperature of the wiring when the second current was flown rose by 100° C. for a pulse width of 100 nsec or by 210° C. for a pulse width of 10 μsec as compared to the temperature when the first current was flown.

Figure 5:
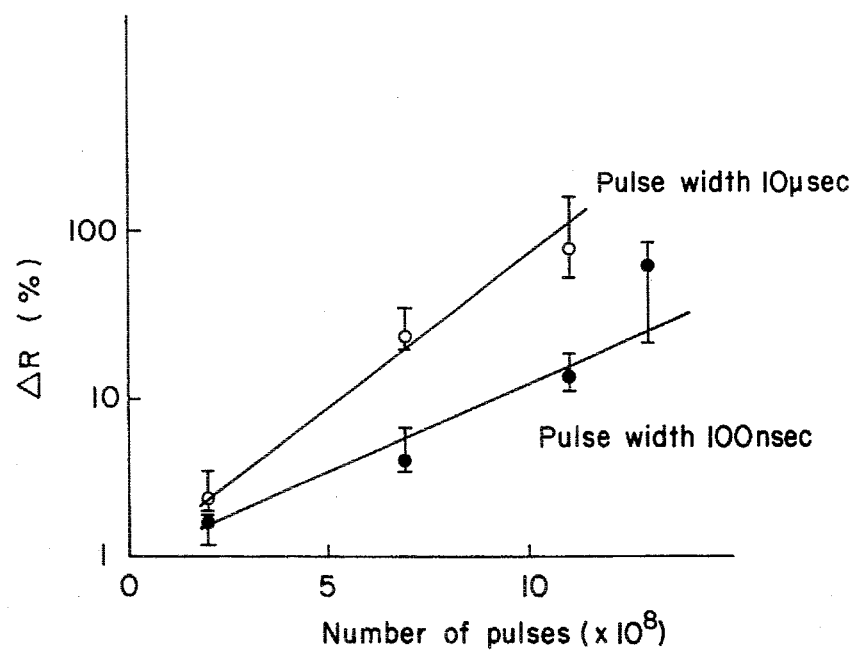
FIG. 5 is a graph showing a number of pulses loaded to the Cu sputter film and change in a resistance value.

Change of a resistance value in wiring in case of a Cu sputter film is shown in FIG. 5. The straight line shown in the figure was obtained by subjecting average values of data at each temperature to linear approximation by means of the method of least square.

As described above, with the present invention, change in a resistance value due to only stress migration can be obtained, and it becomes possible to evaluate a capability of wiring material to withstand stress migration.

INDUSTRIAL AVAILABILITY

With the invention as described in claim 1, it is possible to accurately measure a capability of wiring material to withstand electro-migration within a short period of time, and with the invention as claimed in claim 2, it is possible to evaluate a capability of wiring material to withstand stress migration. Namely with the present invention, electro-migration and stress migration can independently be evaluated, and it is possible to provide a method of current-driven conductive wiring material which enables effective data feedback to development of materials for wiring.

I claim:

1. A method of evaluating current-driven conductive material for evaluating a capability of wiring material to withstand electro-migration within a shorter period of time by repeating several times an operating cycle comprising the steps of: flowing a first current in a wiring pattern made of conductive material to measure a resistance value of the wiring pattern, then flowing a second current having a current value larger than said first current for a specified period of time to generate electro-migration in said wiring pattern, then turning off said second current, again flowing said first current to measure a resistance value in said wiring pattern, wherein the capability of said wiring to withstand electro-migration is evaluated by adjusting a time for flowing said second current to a fully smaller value than a period of time for flowing said first current and controlling temperature rise when said second current is flown to 50° C. or more lower than that when said first current is flown.

2. A method of evaluating current-driven conductive material according to claim 1, wherein the time for loading said second current is in a range from 10 psec to 50 nsec when a density of said second density is in a range from $10^6$ to $10^9$ A/cm$^2$.

3. A method of evaluating current-driven conductive material for evaluating a capability of wiring material to withstand stress migration within a shorter period of time by repeating several times an operating cycle comprising the steps of: flowing a first current in a wiring pattern made of conductive material to measure a resistance value of the wiring pattern, then flowing a second current having a current value larger than said first current for a specified period of time to generate stress migration in said wiring pattern, then turning off said second current, again flowing said first current to measure a resistance value in said wiring pattern, wherein stress migration generated in said wiring pattern is measured by adjusting a value of said second current to a current value at which practically electro-migration does not occur, controlling a cycle of flowing said second current repeatedly to less than 10 msec, and setting a time for flowing said second current so that a temperature of said wiring pattern will be 100° C. or more higher than the temperature when said first current is flown.

4. A method of evaluating current-driven conductive material according to claim 3, wherein, when a density of said second current is in a range from $10^4$ to $10^6$ A/cm$^2$, a time for flowing said second current is in a range from 10 nsec to 10 μsec.

5. A method of evaluating current-driven conductive material according to claim 3, wherein said second current is loaded in the position direction and in the negative direction alternately.

6. A method of evaluating current-driven conductive material according to claim 4, wherein said second current is loaded in the position direction and in the negative direction alternately.

* * * * *